United States Patent
Shibayama

(10) Patent No.: US 9,281,801 B2
(45) Date of Patent: Mar. 8, 2016

(54) DIGITAL FILTER CIRCUIT AND DIGITAL FILTER CONTROL METHOD

(75) Inventor: Atsufumi Shibayama, Tokyo (JP)

(73) Assignee: NEC CORPORATION, Tokyo (JP)

( * ) Notice: Subject to any disclaimer, the term of this patent is extended or adjusted under 35 U.S.C. 154(b) by 303 days.

(21) Appl. No.: 13/993,883

(22) PCT Filed: Aug. 18, 2011

(86) PCT No.: PCT/JP2011/069098
§ 371 (c)(1),
(2), (4) Date: Jun. 13, 2013

(87) PCT Pub. No.: WO2012/086262
PCT Pub. Date: Jun. 28, 2012

(65) Prior Publication Data
US 2013/0262545 A1    Oct. 3, 2013

(30) Foreign Application Priority Data
Dec. 21, 2010  (JP) .................................. 2010-284137

(51) Int. Cl.
*H03H 17/02*    (2006.01)

(52) U.S. Cl.
CPC ....... *H03H 17/0248* (2013.01); *H03H 17/0213* (2013.01)

(58) Field of Classification Search
CPC .......... H03H 17/0213; H03H 17/0216; H03H 2017/0214
See application file for complete search history.

(56) References Cited

U.S. PATENT DOCUMENTS

| 5,535,240 A * | 7/1996 | Carney et al. ............ 375/219 |
| 2006/0159189 A1 * | 7/2006 | Balakrishnan et al. ....... 375/260 |

FOREIGN PATENT DOCUMENTS

| CN | 1152981 A | 6/1997 |
| CN | 1567807 A | 1/2005 |
| JP | 8-23262 A | 1/1996 |
| JP | 9-135151 A | 5/1997 |
| JP | 2006-304192 A | 11/2006 |

(Continued)

OTHER PUBLICATIONS

International Search Report for PCT Application No. PCT/JP2011/069098 mailed on Jan. 10, 2012.

(Continued)

*Primary Examiner* — Chuong D Ngo

(57) ABSTRACT

A digital filter circuit and a digital filter control method are capable of reducing circuit scale and power consumption for filter processing in a frequency domain such as an overlap FDE method. The digital filter circuit according to the present invention includes: an overlap addition unit for giving an overlap of M data (M is a positive integer) between the block and the previous block; an FFT processing unit for transforming the generated block by FFT processing; a filter computation unit for performing filter processing to the transformed block; an IFFT unit for transforming the block, which the filter processing was performed to, by IFFT processing; an overlap removal unit for removing M units of data from both ends of the transformed block; and a clock generation unit for setting the frequency of a filter processing clock signal based on a value of M, wherein the filter processing clock signal drives the data output unit of the overlap addition unit, the FFT unit, the filter computation unit, the IFFT unit, and the input unit of the overlap removal unit.

7 Claims, 7 Drawing Sheets

(56) References Cited

FOREIGN PATENT DOCUMENTS

| JP | 2007-201523 A | 8/2007 |
|---|---|---|
| JP | 2010-130355 A | 6/2010 |
| JP | 2010-232857 A | 10/2010 |
| WO | 00/19654 A1 | 4/2000 |

OTHER PUBLICATIONS

Marie-Eve Grandmaison et al., "Frequency domain filter using an accurate reconfigurable FFT/IFFT core", Circuits and Systems, 2004. NEWCAS 2004. The 2nd Annual IEEE Northeast Workshop on, p. 165-168.

Chinese Office Action for CN Application No. 201180062164.1 issued on Jan. 14, 2015 with English Translation.

Marie-Eve Grandmaison, et al. "Frequency Domain Filter Using an Accurate Reconfigurable FFT/IFFT Core", Regular Session D: Signal Processing, Filtering, Circuits and Systems, 2004. NEWCAS 2004. Jun. 20-23, 2004, The 2nd Annual IEEE Northeast Workshop on Montreal, Canada, Jun. 20, 2004, pp. 165-168.

John G. Proakis, et al. "Filtering of Long Data Sequences", Section 5.3.2 in "Digital Signal Processing; Principles, Algorithms, and Applications", Principle-Hall International, Inc., Third Edition, Jan. 1, 1996, pp. 430-433.

The Extended European Search Report for EP Application No. 11851747.3 dated on Jun. 6, 2014.

* cited by examiner

Fig.6

| NUMBER OF OVERLAPS | FFT BLOCK SIZE | CLOCK FREQUENCY |
|---|---|---|
| 0 | 2048 | 500.00 |
| 128 | 2048 | 533.33 |
| 256 | 2048 | 571.43 |
| 384 | 4096 | 551.72 |
| 512 | 4096 | 571.43 |
| 640 | 8192 | 542.37 |
| 768 | 8192 | 551.72 |
| 896 | 8192 | 561.40 |
| 1024 | 8192 | 571.43 |
| 1152 | 8192 | 581.82 |
| 1280 | 8192 | 592.59 |

SETTING OF OVERLAP NUMBER

SETTING OF FFT BLOCK SIZE 26

SETTING OF FREQUENCY 27

DIGITAL FILTER CIRCUIT AND DIGITAL FILTER CONTROL METHOD

This application is a National Stage Entry of PCT/JP2011/069098 filed Aug. 18, 2011, which claims priority from Japanese Patent Application 2010-284137 filed Dec. 21, 2010, the contents of all of which are incorporated herein by reference, in their entirety.

TECHNICAL FIELD

The present invention relates to an arithmetic processing circuit in digital signal processing and relates to a digital filter circuit and a digital filter control method in particular.

BACKGROUND ART

As a technology which compensates for waveform distortion in signal transmission in wireless communication and cable communication, a frequency domain equalization (FDE) technology is known. In FDE, first, a signal data in the time domain is converted to data in the frequency domain by Fast Fourier Transform (FFT). Then filter processing for equalization is performed and the signal data in the frequency domain is reconverted to the signal data in the time domain by Inverse FFT (IFFT). In FDE, by the above-mentioned processing, the waveform distortion of the signal is compensated for.

Meanwhile, in FFT, it is assumed that a signal repeats periodically, it is a problem that a computation distortion occurs in a signal around both ends of a processing block of FFT. As a technology which solves this problem, for example, an overlap FDE method disclosed in patent documents 1, 2 and 3 can be mentioned. In the overlap FDE method, FFT processing is performed by giving an overlap of a predetermined data between adjacent processing blocks, and then after performing filter processing and reconverting to a time domain signal by IFFT processing, only the signal data of the both ends of the processing block in which the computation-distortion occurs is removed.

As the other related arts, a digital filter device, described in patent document 4, which changes the sampling period of digital data is mentioned.

PRIOR ART DOCUMENT

Patent Document

[Patent document 1] Japanese Patent Application Laid-Open No. 2006-304192
[Patent document 2] Japanese Patent Application Laid-Open No. 2010-130355
[Patent document 3] Japanese Patent Application Laid-Open No. 2007-201523
[Patent document 4] Japanese Patent Application Laid-Open No. 1997-135151

SUMMARY OF THE INVENTION

Problem to be Solved by the Invention

However, in the overlap FDE method, at a part of overlapping FFT processing, it is necessary to overlap same input signals and perform the FDE processing. In other words, because of increase in the amount of operations to the overlapped part, the FDE processing requires a higher throughput of processing with the overlapped part than the throughput of the input-output of the signal data.

For example, when the FFT block size is 4096 data and the number of overlap is 1024 data the processing throughput of FDE needs to be 4/3 times the input-output throughput of the data.

As a method to improve the processing throughput of FDE for the increase in the amount of the operation of this overlapped part, the method comprising the step of parallelizing a FDE processing circuit can be considered. However, the method comprising the step of parallelizing the circuit has a problem that the circuit scale and the electric power consumption increase.

An object of the present invention is to provide a digital filter circuit and a digital filter control method capable of solving the problem mentioned above.

Means for Solving the Problem

A digital filter circuit according to the present invention includes: an overlap addition means for generating a block including N data (N is a positive integer) from input data in a time domain by giving an overlap of M data (M is a positive integer) between the block and the previous block; an FFT processing means for transforming the generated block to a block in a frequency domain by performing FFT processing; a filter computation means for performing filter processing to the transformed block in the frequency domain; an IFFT means for transforming the block, which the filter processing was performed to, to a block in the time domain by IFFT processing; an overlap removal means for generating an output signal by removing a total of M data from both ends of the transformed block in the time domain and generating an output signal; and a clock generation means for setting a frequency of a filter processing clock signal based on the number M of overlaps, wherein the filter processing clock signal drives the data output unit of the overlap addition means, the FFT means, the filter computation means, the IFFT means, and the data input unit of the overlap removal means.

A digital filter control method according to the present invention includes: generating a block including N units of data (N is a positive integer) from input data in a time domain by performing overlap addition processing which causes the block to give an overlap of M data (M is a positive integer) between the block and the previous block; transforming the generated block to a block in a frequency domain by performing FFT processing; performing filter processing to the transformed block in the frequency domain; transforming the block, which the filter processing was performed to, to a block in the time domain by IFFT processing; performing overlap removal processing which generates an output signal by removing a total of M data from both ends of the transformed block in the time domain; and setting the frequency of a filter processing clock signal based on a value of the number M of the overlaps, wherein the filter processing clock signal relates to the output of the overlap addition processing, the FFT processing, the filter processing, the IFFT processing, and the input of the overlap removal processing.

Effect of the Invention

According to the present invention, in filter processing in a frequency domain of an overlap FDE method, the circuit scale and the electric power consumption can be reduced.

BRIEF DESCRIPTION OF THE DRAWINGS

FIG. 6 is a table diagram showing an exemplary configuration of a setup table provided in the digital filter circuit shown in FIG. 4.

EXEMPLARY EMBODIMENTS FOR CARRYING OUT OF THE INVENTION

First Exemplary Embodiment

Figure 1:
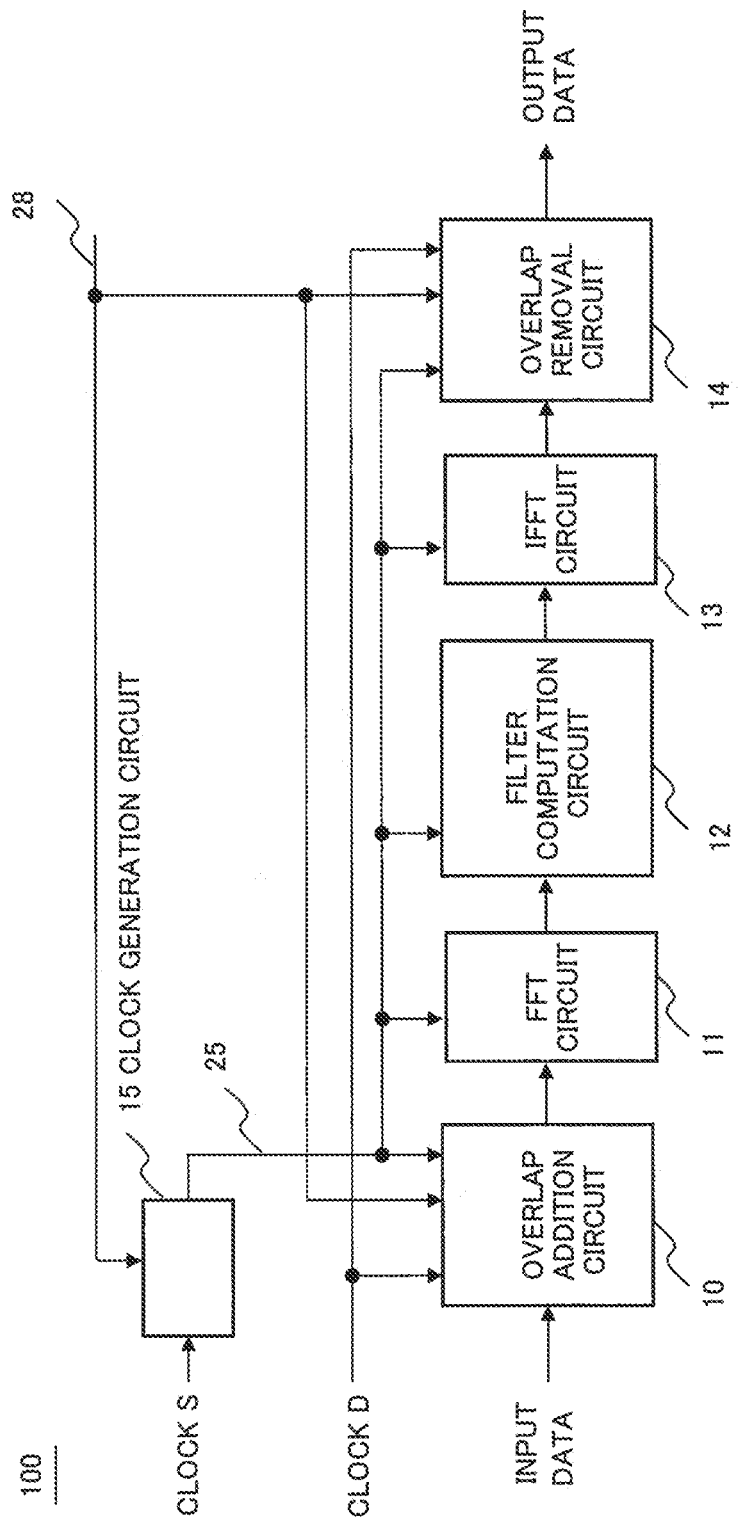
FIG. 1 is a block diagram showing an exemplary configuration of a digital filter circuit according to a first exemplary embodiment of the present invention.

FIG. 1 is a block diagram showing an exemplary configuration of a digital filter circuit 100 according to a first exemplary embodiment of the present invention. The digital filter circuit 100 is a frequency domain filter circuit which performs filter processing in a frequency domain. Specifically, first, after transforming a signal, in a time domain, inputted as an input data to data in a frequency domain by FFT, the digital filter circuit 100 performs filter processing. After that, the digital filter circuit 100 retransforms the data to a signal data in the time domain by IFFT, and outputs the signal data as an output data.

For example, the digital filter circuit 100 refers to an overlap number setting signal 28 which is given from a higher level circuit (not shown) such as a CPU (Central Processing Unit) or the like, and determines the number of the overlap.

The digital filter circuit 100 includes an overlap addition circuit 10, a FFT circuit 11, a filter computation circuit 12, an IFFT circuit 13, an overlap removal circuit 14 and a clock generation circuit 15 at least.

The overlap addition circuit 10 successively generates a block including N data from an input data which is an input signal on the time domain and outputs the data to the FFT circuit 11. At that time, the overlap addition circuit 10 gives an overlap of M data between each block and a previous block. Here, both of N and M are positive integers together. The number M of overlapped data is determined based on the overlap number setting signal 28. The overlap addition circuit 10 inputs an input data synchronizing with a clock D. And the overlap addition circuit 10 outputs the generated block to the FFT circuit 11 synchronizing with a filter clock 25.

Further, the overlap addition circuit 10 can be composed by a dual port memory, for example. At that time, writing to the dual port memory may be performed synchronizing with the clock D, and reading from the dual port memory may be performed synchronizing with the filter clock 25.

The FFT circuit 11 performs FFT to the input signal, in the time domain, outputted from the overlap addition circuit 10 and overlapped with M data, so that the input signal is transformed into a signal in the frequency domain and outputs the signal to the filter computation circuit 12. The FFT circuit 11 operates synchronizing with the filter clock 25.

The filter computation circuit 12 performs filter processing to the signal, in the frequency domain, transformed by the FFT circuit 11, and outputs the signal to the IFFT circuit 13. For example, the filter computation circuit 12 can be composed by a complex number multiplier when the digital filter circuit 100 carries out equalization processing of signal distortion in a communication channel. The filter computation circuit 12 operates synchronizing with the filter clock 25.

The IFFT circuit 13 performs IFFT to the signal, in the frequency domain, outputted from the filter computation circuit 12 after filter processing, so that the signal is retransformed in a signal in the time domain and outputs the signal in the time domain to the overlap removal circuit 14. The IFFT circuit 13 operates synchronizing with the filter clock 25.

The overlap removal circuit 14 removes a total of M data from the both ends of each block including N data that are the signal, in the time domain, retransformed by the IFFT circuit 13 and takes out only a midsection of the block, and outputs the midsection of the block as an output data. The number M of removed data is determined based on the overlap number setting signal 28.

The overlap removal circuit 14 inputs data from the IFFT circuit 13 synchronizing with the filter clock 25. And the overlap removal circuit 14 outputs the output data synchronizing with the clock D.

Further, the overlap removal circuit 14 can be composed by a dual port memory, for example. At that time, writing to the dual port memory may be performed synchronizing with the filter clock 25, and reading from the dual port memory may be performed synchronizing with the clock D.

The clock generation circuit 15 generates the filter clock 25 which is a new clock signal from a clock S and outputs the filter clock 25 to the overlap addition circuit 10, the FFT circuit 11, the filter computation circuit 12, the IFFT circuit 13 and the overlap removal circuit 14.

The clock generation circuit 15 determines a frequency of the filter clock 25 based on the inputted overlap number setting signal 28.

Further, when the frequency of the clock S is higher than that of the filter clock 25, for example, the clock generation circuit 15 can be composed by a frequency divider and can generate the filter clock 25 by dividing the clock S. On the other hand, when the frequency of the clock S is lower than that of the filter clock 25, for example, the clock generation circuit 15 can be composed by a PLL (Phase Locked Loop) circuit, and can generate the filter clock 25 by multiplying the clock S.

Figure 2:
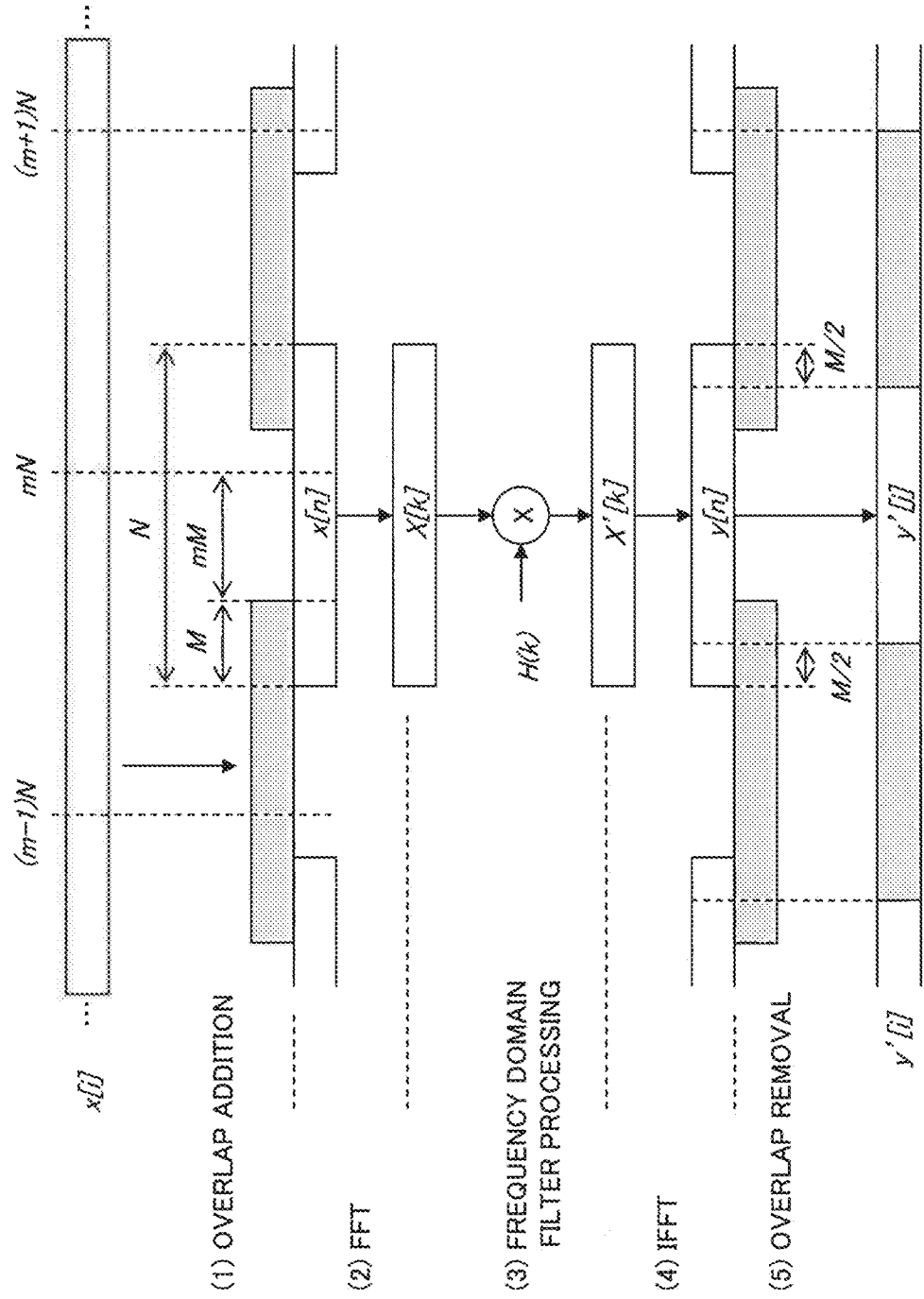
FIG. 2 is a sequence diagram showing an example of operation of the digital filter circuit shown in FIG. 1.
Figure 3:
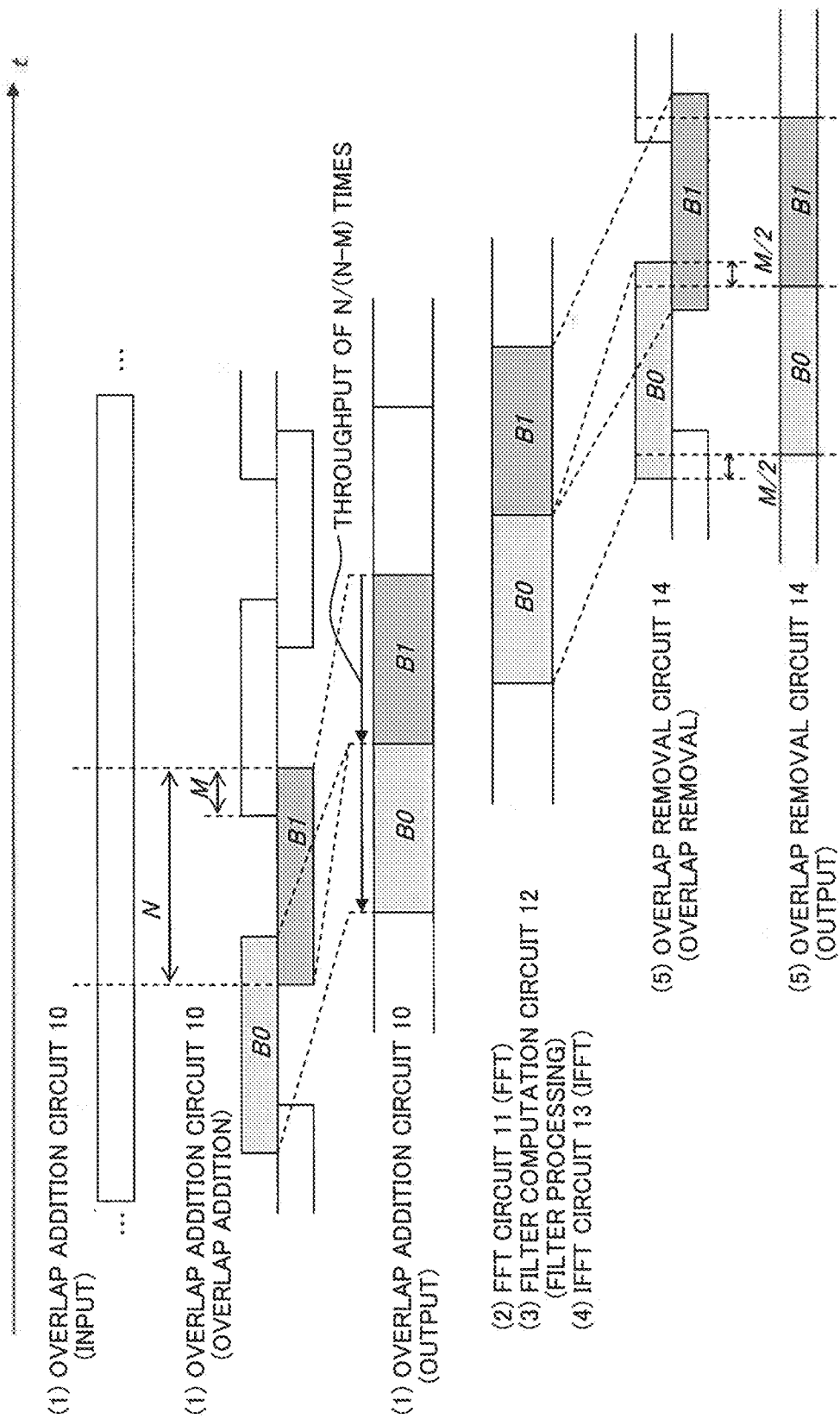
FIG. 3 is a timing chart showing an example of operation of the digital filter circuit shown in FIG. 1.

Hereinafter, operation of the digital filter circuit 100 shown in FIG. 1 will be described with reference to FIG. 2 and FIG. 3. FIG. 2 is a sequence diagram showing an example of operation of the digital filter circuit shown in FIG. 1. FIG. 3 is a timing chart showing an example of operation of the digital filter circuit shown in FIG. 1. In the following description, processing steps (1)-(5) correspond to processing steps (1)-(5) in FIG. 2 and FIG. 3, respectively.

(1) Overlap Addition Processing

The overlap addition circuit 10 successively generates a block including N data from an input data which is an input signal in the time domain. At that time, the overlap addition circuit 10 gives an overlap of each of the blocks and a previous block for only M data.

When the input data is set to x[i] (i=0, 1, . . . ), a block of N data can be expressed by $$x[j] (j=m(N-M)-N \text{ to } m(N-M)-1).$$

Here, N is FFT block size and M is the number of overlaps. M is a positive integer.

(2) FFT Processing

The FFT circuit 11 performs a Fast Fourier Transform (FFT) to a block including signal data in the time domain and transforms the block into a block including a signal data in the frequency domain.

When the block including the signal N data in the time domain is anew set to x[n](n=0, 1 . . . , N−1), a block X[k] in the frequency domain after FFT processing can be given by Equation 1.

$$X[k] = \sum_{n=0}^{N-1} x[n] \cdot W_N^{-nk} \quad \text{(Equation 1)}$$

$$W_N = \exp\left(-j\frac{2\pi}{N}\right)$$

$$(k = 0, 1, \ldots, N-1)$$

(3) Frequency Domain Filter Processing

The filter computation circuit 12 performs filter processing to each signal data, in the frequency domain, which composes a block after FFT processing.

A block X'[k] after filter processing to a block X[k] before filter processing is given by $$X'[k]=H(k)\cdot X[k] \quad \text{(Equation 2)}$$

k=0, 1 . . . , N−1.

In Equation 2, H(k) indicates a filter factor.

(4) IFFT Processing

The IFFT circuit 13 performs IFFT to a block including a signal data in the frequency domain after filter processing and retransforms the block to a block including a signal data in the time domain.

A block y[n] after IFFT processing for the block X'[k] before IFFT processing is given by Equation 3.

$$y[n] = \frac{1}{N}\sum_{k=0}^{N-1} X'[k] \cdot W_N^{nk} \quad \text{(Equation 3)}$$

$$W_N = \exp\left(-j\frac{2\pi}{N}\right)$$

$$(n = 0, 1, \ldots, N-1)$$

(5) Overlap Removal Processing

The overlap removal circuit 14 extracts a midsection from the block y[n] including N signal data after IFFT processing leaving M/2 overlapped data in the head and end of the block and generates y'[j](j=M/2 to N−1−M/2) signal data sequence of (N−M) units by removing the overlaps.

As mentioned above, the digital filter circuit 100 adds an overlap of M data to N data and performs filter processing, and removes the overlap of M data again. Accordingly, the processing throughput, which is higher for the overlap than the throughputs of the input and the output of data, is required for the filter processing. Specifically, the processing throughput, which is N/(N−M) times or more the throughputs of the input and the output of data, is required for the filter processing.

In this exemplary embodiment, the throughputs of the input and the output of data in the digital filter circuit 100 are determined by the frequency of the clock D. The reason is that the data input in the overlap addition circuit 10 and the data output in the overlap removal circuit 14 operate synchronizing with the clock D.

On the other hand, the processing throughput of the filter processing in the digital filter circuit 100 is determined by the frequency of the filter clock 25. The reason is that the data output in the overlap addition circuit 10, the data input in the overlap removal circuit 14, the FFT circuit 11, the filter computation circuit 12 and the IFFT circuit 13 operate synchronizing with the filter clock 25.

Here, in this exemplary embodiment, the filter processing is performed with the throughput of N/(N−M) times as many as the throughputs of the data input and the data output by making the frequency of the filter clock 25 N/(N−M) times the clock D.

Specifically, when a frequency of the clock D is set to fD, the FFT block size is set to N, and the number of overlap is set to M, the frequency fF of the filter clock 25 is set by the following Equation 4.

$$fF=fD\times N/(N-M) \quad \text{(Equation 4)}$$

At that time, the digital filter circuit 100 performs filter processing in every cycle of the filter clock 25 to the inputted data in every cycle of the clock D, and outputs the data, for which filter processing was performed, in every cycle of the clock D.

Generally, when throughputs of both input/output data and filter processing are not identical in a digital filter circuit, flow controls are needed, such as a control of suspension and starting of an input-output of data and a control of suspension and starting of filter processing. On the other hand, according to the digital filter circuit 100 of this exemplary embodiment, this flow control is unnecessary. Thereby, because the circuit is simple, circuit scale and power consumption can be reduced.

Specifically, for example, when the overlap addition circuit 10 and the overlap removal circuit 14 are realized by a dual port memory, it does not occur that the memory is full of data, or empty thereof. Accordingly, a flow control which suspends or starts writing into the memory and reading from the memory is unnecessary. Because the circuit can be simplified, as a result, the circuit scale and the power consumption can be reduced.

According to the first exemplary embodiment described above, in the frequency domain filter processing using overlap FFT, in accordance with the required number M of overlaps and the FFT block size N, the operation frequency of the filter processing is set to be N/(N−M) times as high as the operating frequency of the input-output of data.

Therefore, the digital filter circuit 100 according to the first exemplary embodiment operates in accordance with the required number of overlaps by the operating frequency enough necessary to perform filter processing to an input signal, which is inputted, without delaying. For this reason, the power consumption can be reduced.

Moreover, because a flow control for an input-output of data and filter processing is not needed, the required memory size can be reduced and the circuit configuration can be simplified in the digital filter circuit 100. Therefore, the circuit scale and the power consumption can be reduced.

Second Exemplary Embodiment

Figure 4:
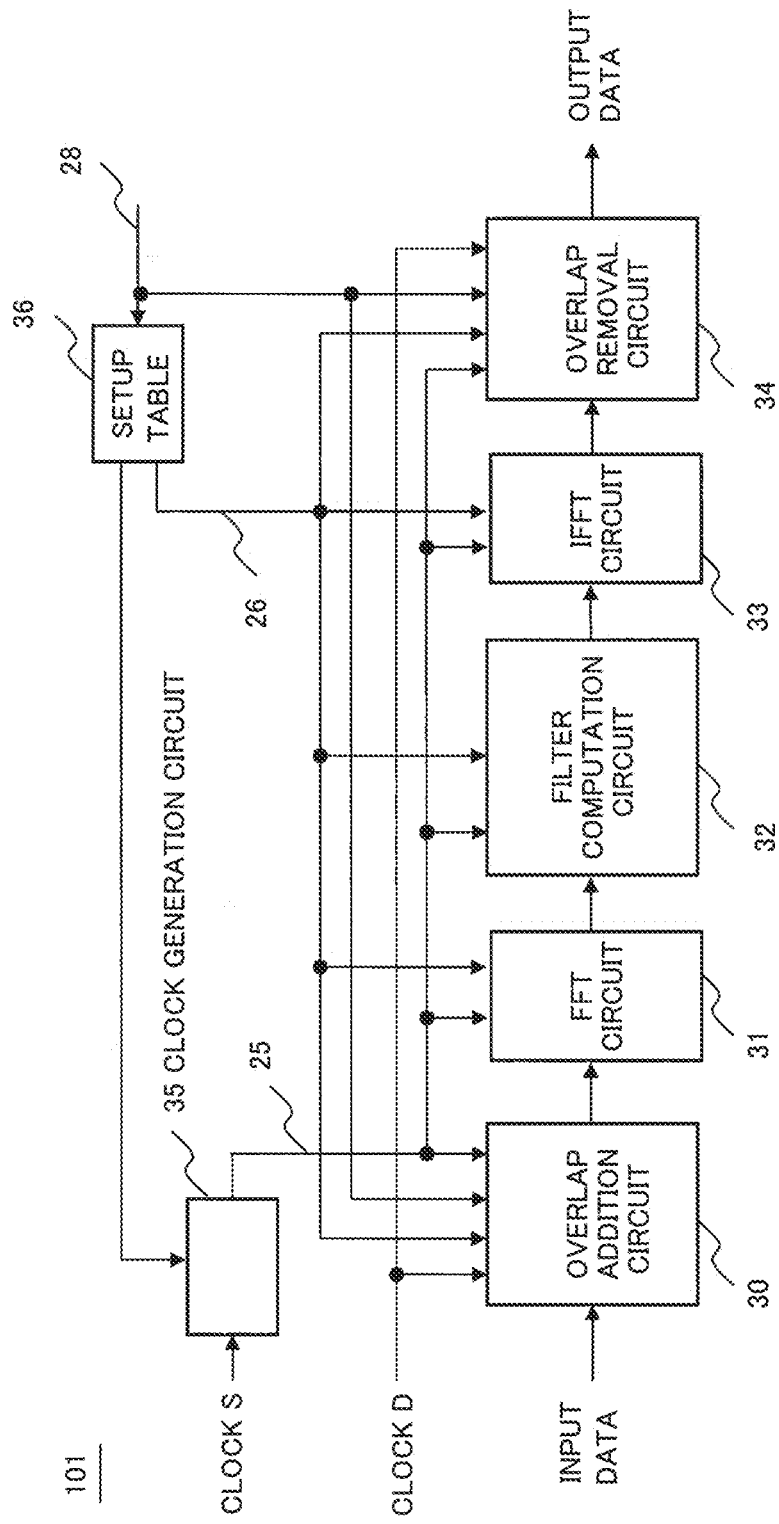
FIG. 4 is a block diagram showing an exemplary configuration of a digital filter circuit according to a second exemplary embodiment of the present invention.

FIG. 4 is a block diagram showing an exemplary configuration of a digital filter circuit 101 according to a second exemplary embodiment of the present invention. The digital filter circuit 101 is a frequency domain filter circuit which performs filter processing in a frequency domain like the digital filter circuit 100 of the first exemplary embodiment. Basic operation of a frequency domain filter circuit has been already described in the first exemplary embodiment.

The digital filter circuit 101 refers to the overlap number setting signal 28 which is given from a higher level circuit such as a CPU like the digital filter circuit 100 of the first exemplary embodiment and determines the number of overlap.

The feature of the digital filter circuit 101 is that a setup table 36 is added to the digital filter circuit 100 of the first exemplary embodiment. Further, while the basic function of each component besides the setup table 36 is identical with each component in the digital filter circuit 100 of FIG. 1, it is but different from the first exemplary embodiment in a part of functions according to an addition of the setup table 36. Accordingly, codes which are different from FIG. 1 will be attached in FIG. 4 about each above-mentioned component.

The digital filter circuit 101 includes at least an overlap addition circuit 30, a FFT circuit 31, a filter computation circuit 32, an IFFT circuit 33, an overlap removal circuit 34, a clock generation circuit 35 and a setup table 36.

The overlap addition circuit 30 generates successively a block including N data from an input data which is an input signal in the time domain and outputs the block to the FFT circuit 31. At that time, the overlap addition circuit 30 gives an overlap of M data between each of the blocks and a previous block. Further, like the first exemplary embodiment, both N and M are positive integers. The number N of data which compose a block is determined based on a FFT block size setting signal 26 which is outputted from the setup table 36. Further, the number M of the overlapped data is determined based on the overlap number setting signal 28. The overlap addition circuit 30 inputs an input data synchronizing with the clock D. Further the overlap addition circuit 30 outputs the block which was generated synchronizing with the filter clock 25 to the FFT circuit 31.

Further, for example, the overlap addition circuit 30 can be composed by a dual port memory. At that time, writing to the dual port memory may be performed synchronizing with the clock D, and reading from the dual port memory may be performed synchronizing with the filter clock 25.

The FFT circuit 31 performs FFT to the input signal, in the time domain, outputted from the overlap addition circuit 30 and overlapped with M data, so that the input signal is transformed into a signal in the frequency domain and outputs the signal to the filter computation circuit 32. At that time, the process unit (the block size) of FFT is determined based on the FFT block size setting signal 26 which is outputted from the setup table 36. Here, the block size can be changed easily by changes of the number of rows of the butterfly circuit which composes the FFT circuit 31. The FFT circuit 31 operates synchronizing with the filter clock 25.

The filter computation circuit 32 performs filter processing to the signal in the frequency domain transformed by the FFT circuit 31, and outputs the signal to the IFFT circuit 33. For example, the filter computation circuit 32 can be composed by a complex number multiplier when the digital filter circuit 101 carries out equalization processing of signal distortion in a communication channel. At that time, the process unit (the block size) of the filter processing is determined based on the FFT block size setting signal 26 which is outputted from the setup table 36. The filter computation circuit 32 operates synchronizing with the filter clock 25.

The IFFT circuit 33 performs IFFT to the signal, in the frequency domain, outputted from the filter computation circuit 32 after filter processing, so that the signal is retransformed in the frequency in a signal in the time domain and outputs the signal to the overlap removal circuit 34. At that time, the process unit (the block size) of IFFT is determined based on the FFT block size setting signal 26 which is outputted from the setup table 36. Here, the block size can be changed easily by changes of the number of rows of the butterfly circuit which composes the IFFT circuit 33. The IFFT circuit 33 operates synchronizing with the filter clock 25.

The overlap removal circuit 34 removes a total of M data from the both ends of each block including N data which is the signal in the time domain retransformed by the IFFT circuit 33 and takes out only a midsection in the block, and outputs the midsection of the block as an output data. The number N of data of N which compose the block is determined based on the FFT block size setting signal 26 which is outputted from the setup table 36. Further, the number M of the removed data is determined based on the overlap number setting signal 28.

The overlap removal circuit 34 inputs data from the IFFT circuit 33 synchronizing with the filter clock 25. And the overlap removal circuit 34 outputs the output data synchronizing with the clock D.

Further, the overlap removal circuit 34 can be composed by a dual port memory, for example. At that time, writing to the dual port memory may be performed synchronizing with the filter clock 25, and reading from the dual port memory may be performed synchronizing with the clock D.

The clock generation circuit 35 generates the filter clock 25 which is a new clock signal from a clock S and outputs the filter clock 25 to the overlap addition circuit 30, the FFT circuit 31, the filter computation circuit 32, the IFFT circuit 33 and the overlap removal circuit 34.

A frequency of the filter clock 25 is determined based on the filter clock frequency setting signal 27 which the setup table 36 outputs. When the frequency of the clock S is higher than that of the filter clock 25, for example, the clock generation circuit 35 can be composed by a frequency divider and can generate the filter clock 25 by dividing the clock S. On the other hand, when the frequency of the clock S is lower than that of the filter clock 25, for example, the clock generation circuit 35 can be composed by a PLL (Phase Locked Loop) circuit, and can generate the filter clock 25 by multiplying the clock S.

The setup table 36 holds a set value of the FFT block size in accordance with the inputted overlap number setting signal 28 and outputs the set value of the FFT block size to the overlap addition circuit 30, the FFT circuit 31, the IFFT circuit 33 and the overlap removal circuit 34. The setup table 36 holds a set value of the filter clock frequency in accordance with the setting of the inputted number of the overlaps and outputs the set value of the filter clock frequency to the clock generation circuit 35.

Hereinafter, operation of the digital filter circuit 101 shown in FIG. 4 will be described. The operation regarding filter processing of the digital filter circuit 101 is equal to the operation regarding the filter processing of the digital filter circuit 100 of the first exemplary embodiment shown in FIG. 2 and FIG. 3 by the processing steps (1)-(5).

In other words, the digital filter circuit 101 adds M overlaps to N data, performs filter processing, and removes M overlaps again like the digital filter circuit 100. Accordingly, the processing throughput, which is higher by the overlap than the throughputs of the input and the output of data, is required for the filter processing. Specifically, the processing throughput, which is N/(N−M) times or more the throughputs of the input and the output of data, is required for the filter processing.

In this exemplary embodiment, the throughputs of the input and the output of data in the digital filter circuit 101 are also determined by the frequency of the clock D. The reason is that the data input in the overlap addition circuit 30 and the data output in the overlap removal circuit 34 operate synchronizing with the clock D.

On the other hand, the processing throughput of the filter processing in the digital filter circuit 101 is determined by the frequency of the filter clock 25. The reason is that the data output in the overlap addition circuit 30, the data input in the overlap removal circuit 34, the FFT circuit 31, the filter computation circuit 32 and the IFFT circuit 33 operate synchronizing with the filter clock 25.

Here, in this exemplary embodiment, the filter processing is also performed with the throughput of N/(N−M) times as many as the throughputs of the data input and the data output by the frequency of the filter clock 25 is N/(N−M) times the clock D. Specifically, the frequency fF of the filter clock 25 is set by the above-mentioned Equation 4.

At that time, the digital filter circuit 101 performs filter processing in every cycle of the filter clock 25 to the inputted data in every cycle of the clock D, and outputs the data, which filter processing was performed to, in every cycle of the clock D.

Generally, when throughputs of both input/output data and filter processing are not identical in a digital filter circuit, flow controls are needed, such as a control of suspension and starting of an input-output of data and a control of suspension and starting of filter processing. On the other hand, according to the digital filter circuit 101 of this exemplary embodiment, this flow control is unnecessary. Thereby, because the circuit can be simplified, circuit scale and power consumption can be reduced.

Specifically, for example, when the overlap addition circuit 30 and the overlap removal circuit 34 are realized by a dual port memory, it does not occur that the memory is full of data, or empty thereof. Accordingly, a flow control which suspends or starts writing into the memory and reading from the memory is unnecessary. Because the circuit can be simplified, as a result, the circuit scale and the power consumption can be reduced.

Meanwhile, it is obvious from Equation 4 of the frequency fF of the above-mentioned filter clock 25 that the frequency of the filter clock 25 can be low when the number M of the overlaps is smaller and smaller, and the FFT block size N is larger and larger.

However, because the required number M of the overlaps is determined based on the impulse response length of the filter which is mainly realized in the digital filter circuit 101, it is difficult to set freely the required number M of the overlaps. Accordingly, if the FFT block size N is large against the required number M of the overlaps, the frequency of the filter clock 25 can be low. While lower Frequency leads to smaller power consumption, larger size N of FFT block leads to larger power consumption of the FFT circuit 31 and the IFFT circuit 33 themselves.

Accordingly, FFT block size N which gives smallest power consumption should exist for the required number M of the overlaps. In other words, the FFT block size N which gives smallest power consumption is smallest can be determined for the required number M of the overlaps. Further, when the number M of the overlaps and the number N of the FFT block size are determined, the frequency fF of the filter clock 25 is determined from Equation 2.

Hereinafter, a difference between the first exemplary embodiment and the second exemplary embodiment will be described.

Figure 5:
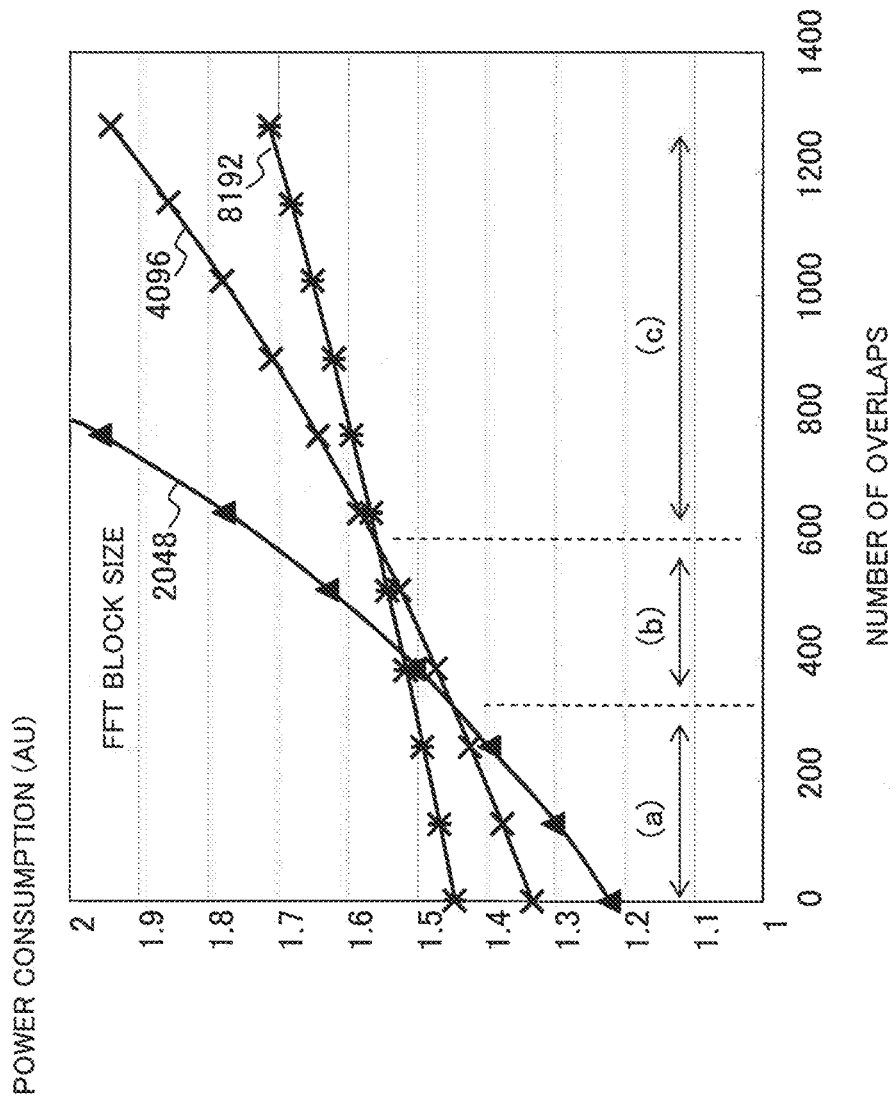
FIG. 5 is a graph showing an example of power consumption of the digital filter circuit shown in FIG. 4.

FIG. 5 is a graph showing an example of power consumption of the digital filter circuit 101 for the FFT block size N of 2048, 4096 and 8192, a case where the number M of the overlaps is changed by 128 units from 0 to 1280.

It can be understood from FIG. 5 that the FFT block sizes N where the power consumption is minimum among at least FFT block size N=2048, 4096 and 8192 are different depending on the number M of the overlaps. Specifically, when the number M of the overlaps is 0, 128 and 256 (area (a) in FIG. 5), the power consumption is minimized when the FFT block size N is 2048. When the number M of the overlaps is 384 and 512 (area (b) in FIG. 5), the power consumption is minimized when the FFT block size N is 4096. When the number M of the overlaps is 640, 768, 896, 1024, 1152 and 1280 (area (c) in FIG. 5), the power consumption is minimized when the FFT block size N is 8192.

The setup table 36 holds a set value of the FFT block size based on the FFT block size setting signal 26 and a set value of the filter clock frequency based on the filter clock frequency setting signal 27 corresponding to a set value of the number of the overlaps based on the overlap number setting signal 26. The setup table 36 outputs the FFT block size setting signal 26 and the filter clock frequency setting signal 27 corresponding to the inputted number of the overlaps.

FIG. 6 is a table diagram showing an exemplary configuration of the setup table 36. In FIG. 6, the FFT block size shown in FIG. 5 that minimizes power consumption is set to each overlap number settings of 128 steps from 0 to 1280 in the setup table 36. Further, a frequency of the filter clock 25 is set by Equation 4 from each overlap number settings and the FFT block size.

In other words, when the number of the overlaps required for the overlap number setting signal 28 is set, the setup table 36 outputs the FFT block size setting signal 26 which minimizes power consumption and the filter clock frequency setting signal 27 which realizes the required throughput of the filter processing.

As a result, the digital filter circuit 101 can operate under the setting of the FFT block size and the frequency of the filter clock 25 that minimize power consumption and to the inputted overlap number setting signal 28.

Further, the contents of the setup table 36 can be set with reference to the power consumption characteristics shown in FIG. 5. In this case, the power consumption characteristics may be obtained by a simulation or by measuring the power consumption of the actual circuit.

Further, the contents of the setup table 36 may be set when the digital filter circuit 101 is designed or is produced thereof and when a higher rank circuit such as CPU which controls the digital filter circuit 101 operates the digital filter circuit 101.

Further, the setup table 36 may not be a circuit for exclusive use. For example, the setup table may be installed on the main memory used by a CPU which controls the digital filter circuit 101.

According to the second exemplary embodiment described above, in the frequency domain filter processing using overlap FFT, the operation frequency of the filter processing is set to N/(N−M) times the operating frequency of the input-output of data in accordance with the required number M of the overlaps and the FFT block size N. Accordingly, the power consumption can be reduced because of being operated by the operating frequency necessary and sufficient to perform filter processing without delaying in accordance with the required number of overlaps.

Further, because a flow control regarding an input-output of data and filter processing is not needed, the required memory size is small and the circuit configuration can be simplified. So the circuit scale and power consumption can be reduced.

Further, according to the second exemplary embodiment, because the FFT block size is adjusted in accordance with the required number of the overlaps, the power consumption can be reduced.

Third Exemplary Embodiment

Figure 7:
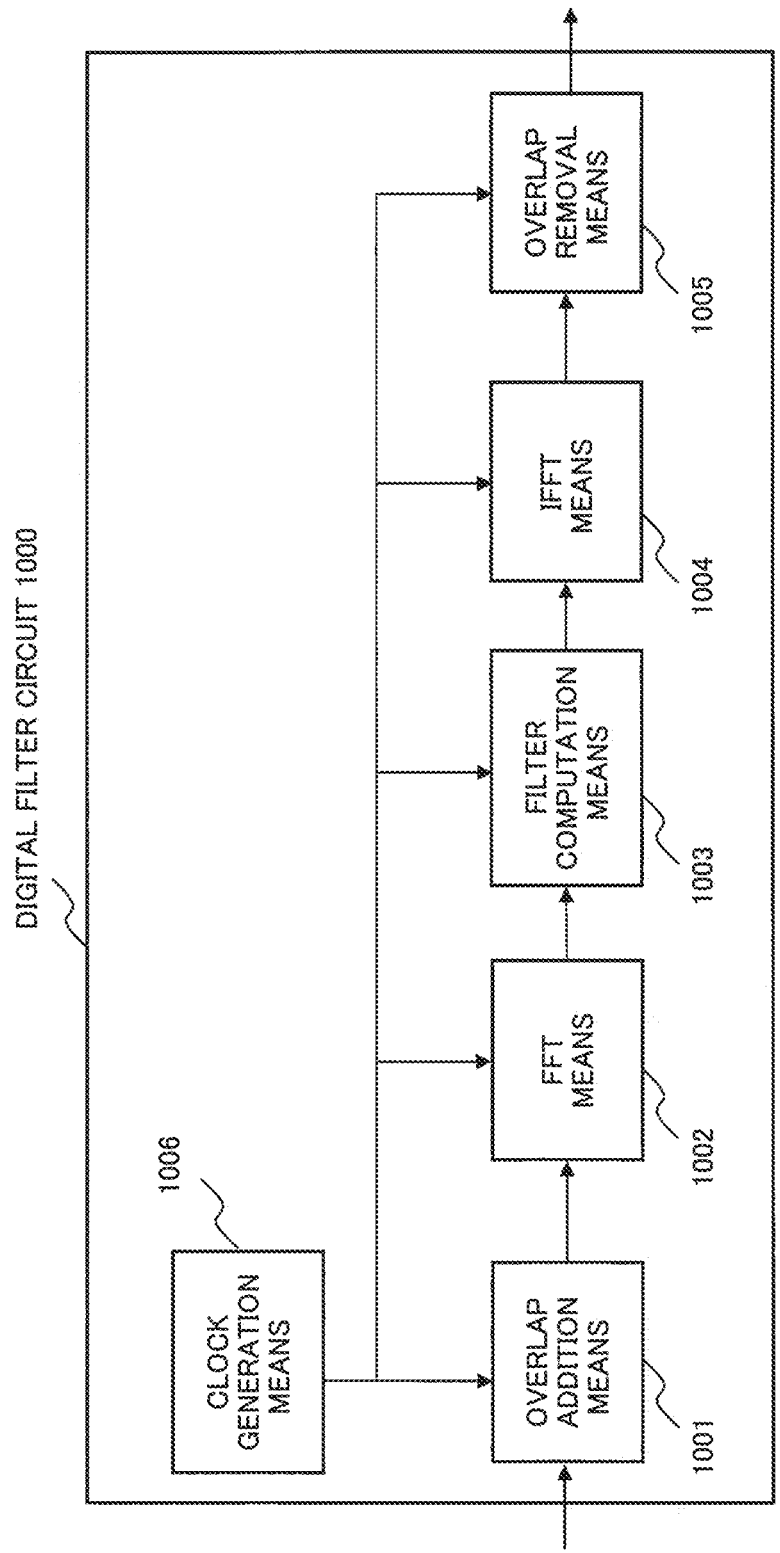
FIG. 7 is a block diagram showing an exemplary configuration of a digital filter circuit according to a third exemplary embodiment of the present invention.

FIG. 7 is a diagram showing an exemplary configuration of a digital filter circuit 1000 according to a third exemplary embodiment of the present invention. According to FIG. 7, the digital filter circuit 1000 includes an overlap addition means 1001, a FFT means 1002, a filter computation means 1003, an IFFT means 1004, an overlap removal means 1005 and a clock generation means 1006.

The overlap addition means 1001 generates a block including N data from an input data in the time domain by overlapping only M data with the previous block. Further, N and M are positive integers.

The FFT means 1002 transforms a block, which is generated by the overlap addition means 1001, by FFT processing to a block in the frequency domain.

The filter computation means 1003 performs filter processing to the block, in the frequency domain, transformed by the FFT means 1002.

The IFFT means 1004 transforms the block, to which the filter computation means 1003 performed the filter processing, to a block in the time domain by IFFT processing.

The overlap removal means 1005 generates an output signal by removing a total of M data from both ends of the block, in the time domain, transformed by the IFFT means 1004.

The clock generation means 1006 sets a frequency of a filter processing clock signal, which drives the data output unit of the overlap addition means 1001, the FFT means 1002, the filter computation means 1003, the IFFT means 1004, and a data input unit of the overlap removal means 1005, based on the value of the number M of the overlaps.

As described above, in the third exemplary embodiment, the frequency of the filter processing clock signal is set based on the value of the number M of the overlaps. Accordingly, in the digital filter circuit 1000 according to the third exemplary embodiment, a flow control regarding the input-output of data and the filter processing is not needed to be performed. Therefore, in the digital filter circuit 1000 according to the third exemplary embodiment, the required memory size is small and the circuit configuration can be simplified.

Accordingly, according to the third exemplary embodiment, in the filter processing in a frequency domain such as an overlap FDE method, the circuit scale and the power consumption can be reduced.

Other Exemplary Embodiments

Another exemplary embodiment according to the present invention is a digital filter circuit which comprises: an overlap addition means which generates a block including data of N data (N is a positive integer) from an input data in a time domain by giving an overlap of M data (M is a positive integer) between the block and the previous block; a FFT means which transforms the generated block to a block in a frequency domain by FFT processing; a filter computation means which performs filter processing to the transformed block in the frequency domain; an IFFT means which transforms the block, which the filter processing was performed to, to a block in the time domain by IFFT processing; and an overlap removal means which generates an output signal by removing a total of M data from both ends of the transformed block in the time domain, wherein a frequency of the filter processing clock signal, which drives a data output unit of the overlap addition means, the FFT means, the filter computation means, the IFFT means, and a data input unit of the overlap removal means, is set N/(N−M) times a frequency of an input/output clock signal which drives a data input unit of the overlap addition means and a data output unit of the overlap removal means.

A digital filter control method according to another exemplary embodiment is a control method for a digital filter which includes: an overlap addition means which generates a block including data of N data (N is a positive integer) from an input data in a time domain by giving an overlap of M data (M is a positive integer) between the block and the previous block; a FFT means which transforms the generated block to a block in a frequency domain by FFT processing; a filter computation means which performs filter processing to the transformed block in the frequency domain; an IFFT means which transforms the block, which the filter processing was performed to, to a block in the time domain by IFFT processing; and an overlap removal means which generates an output signal by removing a total of M data from both ends of the transformed block in the time domain, wherein a frequency of the filter processing clock signal, which drives a data output unit of the overlap addition means, the FFT means, the filter computation means, the IFFT means, and a data input unit of the overlap removal means, is set to N/(N−M) times a frequency of an input/output clock signal which drives a data input unit of the overlap addition means and a data output unit of the overlap removal means.

A digital filter control method according to another exemplary embodiment is a control method for a digital filter and includes: an overlap addition means which generates a block including data of N data (N is a positive integer) from an input data in a time domain by giving an overlap of M data (M is a positive integer) between the block and the previous block; a FFT means which transforms the generated block to a block in a frequency domain by FFT processing; a filter computation means which performs filter processing to the transformed block in the frequency domain; an IFFT means which transforms the block, which the filter processing was performed to, to a block in the time domain by IFFT processing; an overlap removal means which generates an output signal by removing a total of M data from both ends of the transformed block in the time domain; and a setup table means which holds FFT size setting indicating the number N of the data which composes the block and clock frequency setting, wherein filter processing is performed based on the FFT size setting and the clock frequency setting which the setup table means outputs according to the number M of the overlaps.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

This application is based upon and claims the benefit of priority from Japanese patent application No. 2010-284137, filed on Dec. 21, 2010, the disclosure of which is incorporated herein in its entirety by reference.

DESCRIPTION OF THE REFERENCE NUMERALS

10 overlap addition circuit
11 FFT circuit 12 filter computation circuit
13 IFFT circuit
14 overlap removal circuit
15 clock generation circuit
25 filter clock
26 FFT block size setting signal
27 filter clock frequency setting signal
28 overlap number setting signal
30 overlap addition circuit
31 FFT circuit
32 filter computation circuit
33 IFFT circuit
34 overlap removal circuit
35 clock generation circuit
36 setup table
100, 101, 1000 digital filter circuit
1001 overlap addition means
1002 FFT means
1003 filter computation means
1004 IFFT means
1005 overlap removal means
1006 clock generation means

What is claimed is:

1. A digital filter circuit comprising:
an overlap addition unit that generates a block including N data (N is a positive integer) from input data in a time domain by giving an overlap of M data (M is a positive integer) between the block and the previous block;
a FFT (Fast Fourier Transform) processing unit that transforms the generated block to a block in a frequency domain by performing FFT processing;
a filter computation unit that performs filter processing to the transformed block in the frequency domain;
an IFFT (Inverse Fast Fourier Transform) unit that transforms the block, which the filter processing was performed to, to a block in the time domain by IFFT processing;
an overlap removal unit that generates an output signal by removing a total of M data from both ends of the transformed block in the time domain; and
a clock generation unit that sets a frequency of a filter processing clock signal based on the number M of the overlaps, wherein the filter processing clock signal drives a data output unit of the overlap addition unit, the FFT unit, the filter computation unit, the IFFT unit, and a data input unit of the overlap removal unit,
wherein the number N is determined based on the number M, so that the power consumption is minimized, and the frequency of the filter processing clock signal is determined based on the number N and the number M.

2. The digital filter circuit according to claim 1, wherein the clock generation unit sets a frequency of the filter processing clock signal N/(N−M) times a frequency of an input-output clock signal which drives the data input unit of the overlap addition unit-and the data output unit of the overlap removal unit.

3. The digital filter circuit according to claim 1, further comprising:
a setup table unit that holds a FFT size setting indicating the number N of the data which constitute the block and a clock frequency setting corresponding to the number M of the overlaps; and
wherein the clock generation unit sets the frequency of the filter processing clock signal based on the FFT size setting and the clock frequency setting which the setup table unit outputs in accordance with an inputted set value of the number M of the overlaps.

4. A digital filter control method comprising:
generating a block including N data (N is a positive integer) from input data in a time domain by performing overlap addition processing which causes the block to give an overlap of M data (M is a positive integer) between the block and the previous block;
transforming the generated block to a block in a frequency domain by performing FFT (Fast Fourier Transform) processing;
performing filter processing to the transformed block in the frequency domain;
transforming the block, which the filter processing was performed to, to a block in the time domain by IFFT (Inverse Fast Fourier Transform) processing;
performing overlap removal processing which generates an output signal by removing a total of M data from both ends of the transformed block in the time domain; and
setting the frequency of a filter processing clock signal based on the number M of the overlaps, wherein the filter processing clock signal relates to an output of the overlap addition processing, the FFT processing, the filter processing, the IFFT processing, and an input of the overlap removal processing;
wherein the number N is determined based on the number M, so that the power consumption is minimized, and the frequency of the filter processing clock signal is determined based on the number N and the number M.

5. The digital filter control method according to claim 4, wherein the frequency of the filter processing clock signal is set to N/(N−M) times a frequency of an input-output clock signal which relates to the input of the overlap addition processing and the output of the overlap removal processing.

6. The digital filter control method according to claim 4, further comprising the steps of:
holding FFT size setting indicating the number N of the data which constitute the block and a clock frequency setting corresponding to the number M of the overlaps; and
setting a frequency of the filter processing clock signal based on the FFT size setting and the clock frequency setting in accordance with an inputted set value of the number M of the overlaps.

7. A digital filter circuit comprising:
an overlap addition means for generating a block including N data (N is a positive integer) from input data in a time domain by giving an overlap of M data (M is a positive integer) between the block and the previous block;
a FFT (Fast Fourier Transform) processing means for transforming the generated block to a block in a frequency domain by performing FFT processing;
a filter computation means for performing filter processing to the transformed block in the frequency domain;
an IFFT (Inverse Fast Fourier Transform) means for transforming the block, which the filter processing was performed to, to a block in the time domain by IFFT processing;
an overlap removal means for generating an output signal by removing a total of M data from both ends of the transformed block in the time domain; and
a clock generation means for setting a frequency of a filter processing clock signal based on the number M of the overlaps, wherein the filter processing clock signal drives a data output unit of the overlap addition means, the FFT means, the filter computation means, the IFFT means, and a data input unit of the overlap removal means, wherein the number N is determined based on the number M, so that the power consumption is minimized, and the frequency of the filter processing clock signal is determined based on the number N and the number M.

* * * * *